(12) United States Patent
Matsuzawa et al.

(10) Patent No.: US 11,518,677 B2
(45) Date of Patent: Dec. 6, 2022

(54) HETEROFULLERENE AND N-TYPE SEMICONDUCTOR FILM USING SAME, AND ELECTRONIC DEVICE

(71) Applicant: Panasonic Intellectual Property Management Co., Ltd., Osaka (JP)

(72) Inventors: Nobuyuki Matsuzawa, Osaka (JP); Masaru Sasago, Osaka (JP); Jun'ichi Naka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 322 days.

(21) Appl. No.: 16/635,011

(22) PCT Filed: Aug. 7, 2018

(86) PCT No.: PCT/JP2018/029501
§ 371 (c)(1),
(2) Date: Jan. 29, 2020

(87) PCT Pub. No.: WO2019/044411
PCT Pub. Date: Mar. 7, 2019

(65) Prior Publication Data
US 2020/0239313 A1    Jul. 30, 2020

(30) Foreign Application Priority Data
Aug. 31, 2017   (JP) ............................. JP2017-167296

(51) Int. Cl.
*C01B 32/156*   (2017.01)
*H01L 51/05*    (2006.01)
(Continued)

(52) U.S. Cl.
CPC .......... *C01B 32/156* (2017.08); *C01B 32/152* (2017.08); *H01L 51/0047* (2013.01);
(Continued)

(58) Field of Classification Search
CPC ............... C01B 32/152; C01P 2002/52; H01L 51/0047; H01L 51/0508; H01L 51/5203;
(Continued)

(56) References Cited

U.S. PATENT DOCUMENTS 6,107,117 A    8/2000   Bao et al.
6,326,640 B1   12/2001  Shi et al.
(Continued)

FOREIGN PATENT DOCUMENTS

CN   102804444   11/2012
JP   7-002507    1/1995
(Continued)

OTHER PUBLICATIONS

Kumashiro, Ryotaro, et al. "Azafullerene (C 59 N) 2 thin-film field-effect transistors." Applied physics letters 84.12 (2004): 2154-2156.*
(Continued)

*Primary Examiner* — Richard M Rump
(74) *Attorney, Agent, or Firm* — Wenderoth, Lind & Ponack, L.L.P.

(57) ABSTRACT

Provided is a heterofullerene where n number (where n is a positive even number) of carbon atoms constituting a fullerene are substituted by n number of boron atoms or n number of nitrogen atoms.

8 Claims, 5 Drawing Sheets m=60 m=70

(51) Int. Cl.
*H01L 51/52* (2006.01)
*H01L 51/00* (2006.01)
*C01B 32/152* (2017.01)
*B82Y 30/00* (2011.01)
*B82Y 40/00* (2011.01)

(52) U.S. Cl.
CPC ...... *H01L 51/0508* (2013.01); *H01L 51/5203* (2013.01); *B82Y 30/00* (2013.01); *B82Y 40/00* (2013.01); *C01P 2002/52* (2013.01)

(58) Field of Classification Search
CPC ............. H01L 51/0541; H01L 51/0545; H01L 51/0558; H01L 29/786; B82Y 30/00; B82Y 40/00; B82Y 10/00
See application file for complete search history.

(56) References Cited

U.S. PATENT DOCUMENTS

| | | | | |
|---|---|---|---|---|
| 8,481,850 | B2 * | 7/2013 | Curtin | ............... H01L 51/424 136/263 |
| 2010/0283047 | A1 | 11/2010 | Facchetti et al. | |
| 2012/0091449 | A1 | 4/2012 | Uetani et al. | |
| 2016/0056383 | A1 | 2/2016 | Bae et al. | |

FOREIGN PATENT DOCUMENTS

| | | | | |
|---|---|---|---|---|
| JP | 9-232589 | | 9/1997 | |
| JP | 10-190001 | | 7/1998 | |
| JP | 2010-001236 | | 1/2010 | |
| JP | 2011-515505 | | 5/2011 | |
| JP | 2015-054855 | | 3/2015 | |
| JP | 2016-521263 | | 7/2016 | |
| WO | WO-2012156723 | A1 * | 11/2012 | ............. B82Y 10/00 |

OTHER PUBLICATIONS

Cao, Baopeng, et al. "Synthesis of C60-NBN and C70-NBN (N= L, 2) by DC arc burning method." Fullerene science and technology 6.4 (1998): 639-648.*

Lee, Hoonkyung, et al. "Room-temperature dissociative hydrogen chemisorption on boron-doped fullerenes." Physical Review B 77.23 (2008): 235101.*

Arie, Arenst Andreas, and Joong Kee Lee. "Effect of boron doped fullerene C60 film coating on the electrochemical characteristics of silicon thin film anodes for lithium secondary batteries." Synthetic metals 161.1-2 (2011): 158-165.*

Xie, Rui-Hua, et al. "Structural, electronic, and magnetic properties of heterofullerene C48B12." Chemical physics letters 375.5-6 (2003): 445-451.*

International Search Report of PCT application No. PCT/JP2018/029501 dated Oct. 30, 2018.

David R. Evans et al., "Estimation of charge carrier mobility in amorphous organic materials using percolation corrected random-walk model", Organic Electronics 29 (2016), p. 50.

K. J. Bowers et al., "Scalable Algorithms for Molecular Dynamics Simulations on Commodity Clusters", Proceedings of the 2006 ACM/IEEE Conference on Supercomputing, ACM, Tampa, Florida, 2006, p. 84.

A. D. Bochevarov et al., "Jaguar: A High-Performance Quantum Chemistry Software Program with Strengths in Life and Materials Sciences", International Journal of Quantum Chemistry, 113 (2013), p. 2110.

Jun-ichi Aihara, "Kinetic Instability 0f Boron Heterofullerenes", Fullerene Science and Technology, 1999, vol. 7, No. 5, pp. 879-896, Especially Abstract, Figure 1 and Figure 2.

Zhongfang Chen et al., "Calculations on all possible isomers of the substituted fullerenes C58X2 (X=N, B) using semiempirical methods", J. Chem. Soc., Faraday Trans., 1998, vol. 94, No. 16, pp. 2269-2276, Especially Abstract and Table 1.

Heinrich R. Karfunkel et al., "Heterofullerenes: Structure and property predictions, possible uses and synthesis proposals", Journal of Computer-Aided Molecular Design, 1992, vol. 6, pp. 521-535, Especially Summary and Fig. 1.

Jayasree Pattanayak et al., "Boron-Nitrogen (BN) Substitution Patterns in C/BN Hybrid Fullerenes: C60-2x(BN)x (x=1-7)", J. Phys. Chem. A, 2001, vol. 105, pp. 8376-8384.

English translation of Office Action dated Aug. 31, 2022, in corresponding Chinese Patent Application No. 201880054420.4.

* cited by examiner

HETEROFULLERENE AND N-TYPE SEMICONDUCTOR FILM USING SAME, AND ELECTRONIC DEVICE

CROSS-REFERENCE TO RELATED APPLICATIONS

This application is a U.S. national stage application of the PCT International Application No. PCT/JP2018/029501 filed on Aug. 7, 2018, which claims the benefit of foreign priority of Japanese patent application 2017-167296 filed on Aug. 31, 2017, the contents all of which are incorporated herein by reference.

FIELD OF THE INVENTION

The present disclosure relates to heterofullerene and an n-type semiconductor film using the heterofullerene, and to an electronic device.

DESCRIPTION OF THE RELATED ART

In recent years, there have been proposed many electronic devices, in particular, thin film transistors (TFT) in which an organic material is used as a formation material of a semiconductor layer (semiconductor film), and the thin film transistor is being actively studied. There are various advantages in using an organic material for a semiconductor layer. For example, while a conventional inorganic thin film transistor based on an inorganic amorphous silicon or the like needs a heating process at about 350° C. to 400° C., an organic TFT can be manufactured by a low-temperature heating process at about 50° C. to 200° C. Therefore, it is possible to manufacture a transistor element on a more heat-labile base (substrate) such as a plastic film. Further, it is also an advantage of organic materials that a large area device can be manufactured at a low cost by forming a semiconductor layer by using an easy forming method such as a spin coating method, an inkjet method, or a printing process.

One of indices for determining a performance of a TFT is carrier mobility of a semiconductor layer, and many studies have been made to improve carrier mobility of an organic semiconductor layer (organic semiconductor film) in an organic TFT. One of these studies that focuses on molecules of an organic material forming an organic semiconductor layer (organic semiconductor film) is a study using, for example poly(3-alkylthiophene) (see PTL 1). Further, an example of a study focusing on the structure of an organic TFT proposes that an alignment film is disposed between a gate insulation layer and an organic semiconductor layer so that a crystalline orientation of the organic semiconductor layer can be enhanced, whereby the carrier mobility is improved (see PTL 2). As described above, achieving an organic semiconductor having excellent properties and achieving a film of such an organic semiconductor lead to improvement in performances of electronic devices. For that purpose, it is necessary to study on improvement of the properties of organic semiconductors and films of such organic semiconductors.

In particular, as an n-type organic semiconductor material, perylenediimide and derivatives of the perylenediimide and in addition fullerene and derivatives of the fullerene are known to have high carrier mobility (see PTLs 3 and 4).

CITATION LIST

Patent Literature

PTL 1: Unexamined Japanese Patent Publication No. 1110-190001
PTL 2: Unexamined Japanese Patent Publication No. 119-232589
PTL 3: Japanese Translation of PCT International Publication No. 2011-515505
PTL4: Japanese Translation of PCT International Publication No. 2016-521263

Non-Patent Literature

NPL 1: David R. Evans et al. Organic Electronics 29 (2016) 50
NPL 2: K. J. Bowers et al. Proc. 2006 ACM/IEEE Conference on Supercomputing, ACM, Tampa, Fla., 2006, p84
NPL3: A. D. Bochevarov et al. Intl. J. Quantum Chem. 113 (2013) 2110

SUMMARY OF THE INVENTION

In a heterofullerene according to the present disclosure, n number (where n is a positive even number) of carbon atoms constituting a fullerene are substituted by n number of boron atoms or n number of nitrogen atoms.

The heterofullerene of the present disclosure exhibits further sufficiently high electron mobility and is therefore useful as a molecule-based organic semiconductor material or a carbon-based electron transfer material, in particular, an n-type semiconductor material.

DETAILED DESCRIPTION OF THE PREFERRED EMBODIMENTS

The inventors of the present disclosure found that new issues as shown below would occur with conventional n-type organic semiconductor materials.

Molecular-based materials such as fullerenes, perylene-diimide, and derivatives of these materials are conventionally known, but those materials have electron mobility of at most about 5 cm²/Vs. In this case, an element having a gate length of 10 μm has an operation speed of at most about 1 MHz. Almost the lower limit of the gate length formable by a coating method is 1 μm, and even such an element has an operation speed of at most about 10 MHz. Therefore, to achieve an operation speed of about 100 MHz, which is necessary for RF-ID (Radio Frequency Identifications), an organic semiconductor material having higher electron mobility has been required.

The present disclosure provides a molecule-based organic semiconductor material having further sufficiently high electron mobility and, in addition, a semiconductor film and an electronic device that use the material.

[Heterofullerene]

The heterofullerene of the present disclosure is a fullerene derivative, in which n number of carbon atoms constituting a fullerene are substituted by n number of boron atoms or n number of nitrogen atoms. Since the carbon atoms to be substituted by n number of boron atoms or n number of nitrogen atoms constitute the fullerene skeleton, the n number of boron atoms or the n number of nitrogen atoms constitute the fullerene skeleton in the heterofullerene.

Because the fullerene includes n number of boron atoms or nitrogen atoms as the atoms constituting the fullerene skeleton, the electron mobility is increased. The number n is a positive even number, and is preferably an even number from 2 to 30 and more preferably an even number from 2 to 12. Note that if n is an odd number, there is an unpaired electron, and the compound is therefore unstable; therefore, the fullerene is not appropriate to be used for the present disclosure. From the point of view of achieving further improvement in the electron mobility, the heterofullerene of the present disclosure is preferably a fullerene derivative in which n number of carbon atoms constituting the fullerene are substituted by n number of boron atoms.

The heterofullerene of the present disclosure may have an organic group. The organic group is a pendant group that is directly connected to the carbon atom constituting the heterofullerene skeleton. The organic group is introduced by cleaving a π-bond between carbon atoms in the heterofullerene skeleton. The organic group may be any organic group. Specific examples of the organic group include, for example: an alkyl group such as a methyl group, an ethyl group, or a propyl group; a substituted alkyl group; a halogen group such as a fluoro group, a chloro group, or a bromo group; a benzyl group; a substituted benzyl group; a naphthyl group; and a substituted naphthyl group.

Hereinafter, the heterofullerene of the present disclosure will be separately described in detail in the case where the heterofullerene of the present disclosure contains boron atoms as heteroatoms and in the case where the heterofullerene of the present disclosure contains nitrogen atoms as heteroatoms. The heterofullerene of the present disclosure containing boron atoms as heteroatoms is referred to as "boraheterofullerene", and the heterofullerene of the present disclosure containing nitrogen atoms as heteroatoms is referred to as "azaheterofullerene".

(Boraheterofullerene)

The boraheterofullerene of the present disclosure is a fullerene derivative, in which n number of carbon atoms constituting a fullerene are substituted by n number of boron atoms or n number of nitrogen atoms. The number n is the same as the above number n. From the point of view of further improvement in the electron mobility in boraheterofullerene, n is preferably an even number from 2 to 30, is more preferably an even number from 2 to 12, and is further preferably an even number from 2 to 10.

The skeleton-constituting atom number m of the boraheterofullerene of the present disclosure is normally 60 or more for one molecule, and may be 60, 70, or 84, for example. From the point of view of a balance between further improvement in the electron mobility and reduction in a manufacturing cost, the skeleton-constituting atom number m of the boraheterofullerene is preferably 60 or 70. Note that the skeleton-constituting atom number m of the boraheterofullerene exactly is a number of all the atoms constituting the heterofullerene skeleton, and is the same as a number of all the carbon atoms constituting the skeleton of the fullerene before substitution by boron atoms, or is the same as the total number of the number of all the carbon atoms and the number of all the boron atoms both constituting the skeleton of the boraheterofullerene.

Figure 1A:
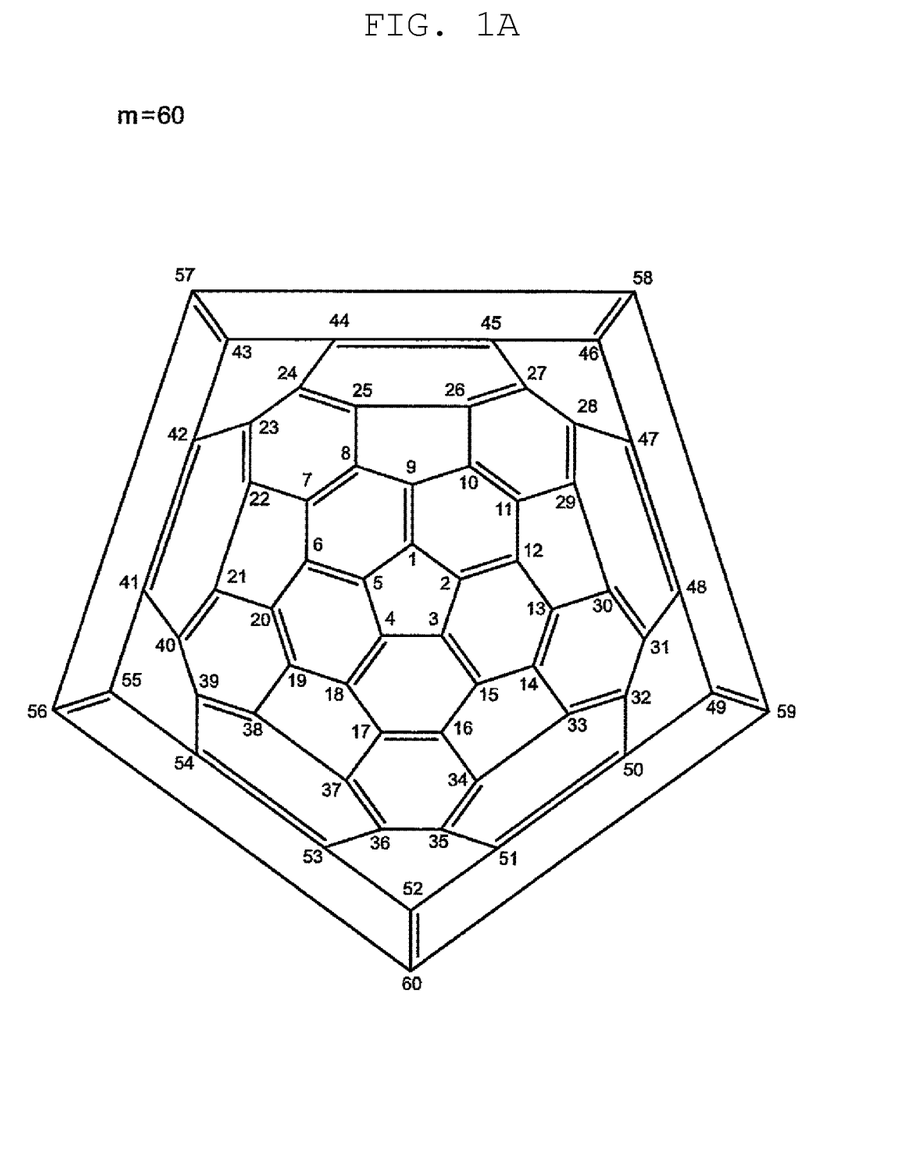
FIG. 1A is a schematic diagram for describing a notation system of substitution positions in a heterofullerene of the present disclosure when a skeleton-constituting atom number m of the heterofullerene is 60.
Figure 1B:
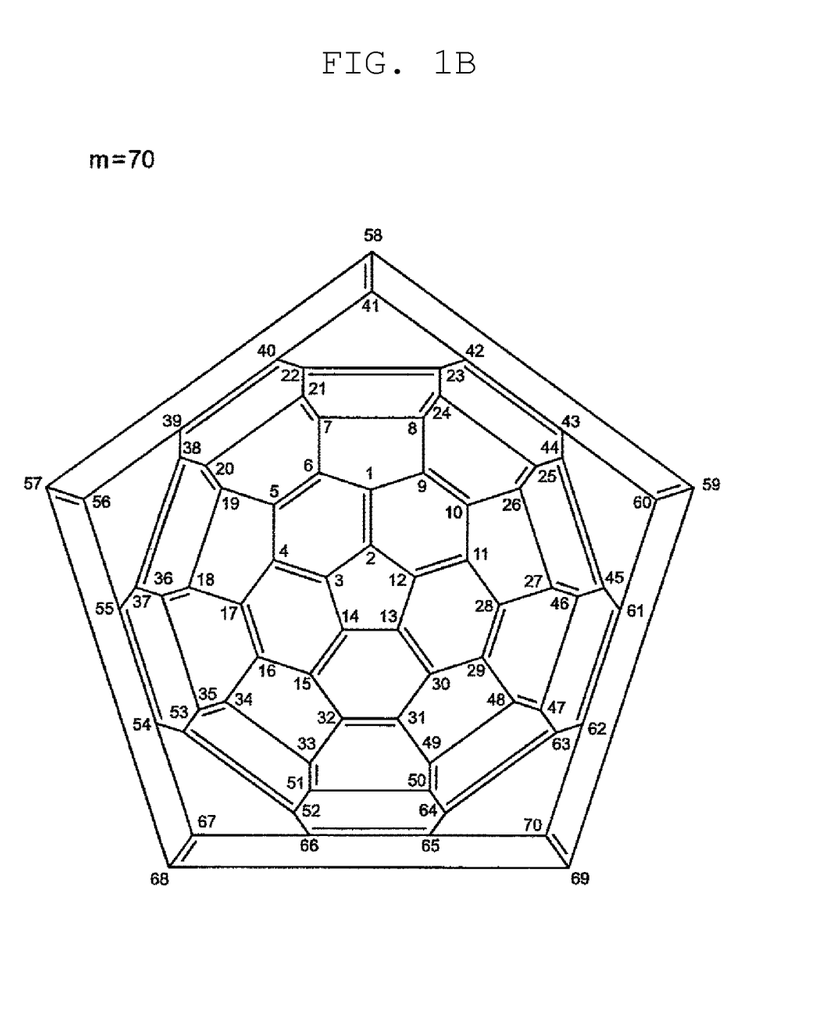
FIG. 1B is a schematic diagram for describing a notation system of substitution positions in a heterofullerene of the present disclosure when a skeleton-constituting atom number m of the heterofullerene is 70.

In the present specification, the substitution positions of heteroatoms in a heterofullerene with m=60 are in accordance with a Schlegel diagram shown in FIG. 1A. Further, the substitution positions of heteroatoms in a heterofullerene with m=70 are in accordance with a Schlegel diagram shown in FIG. 1B.

Figure 2A:
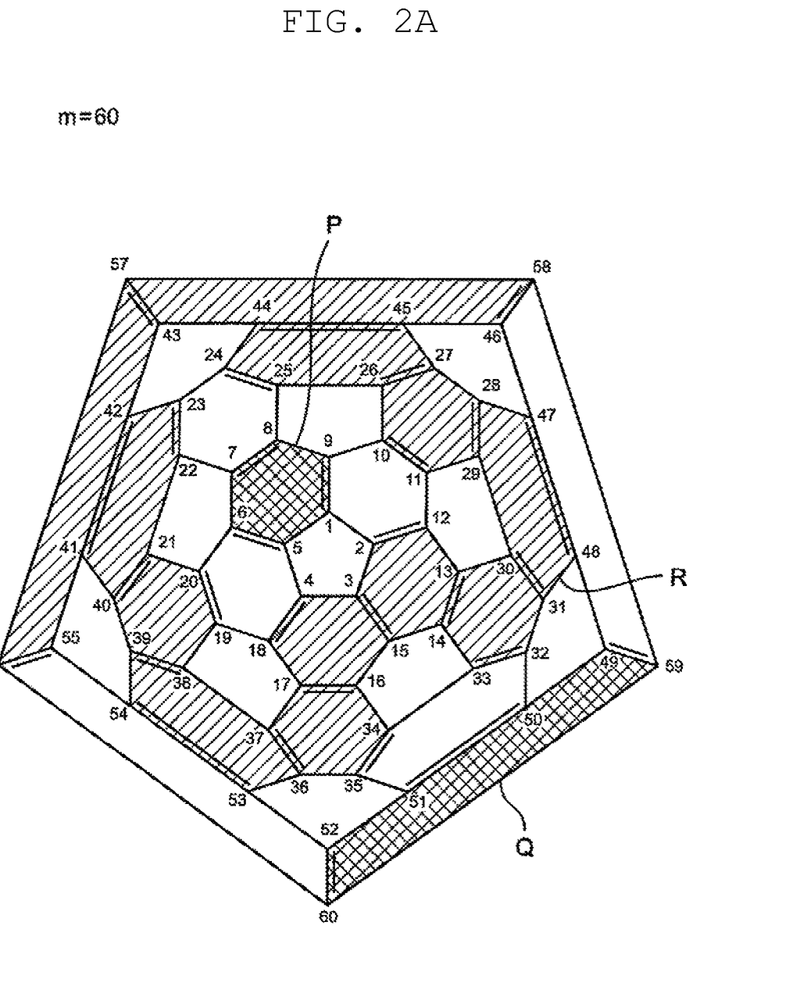
FIG. 2A is a schematic diagram for describing a notation system of preferable substitution positions in a heterofullerene of the present disclosure when a skeleton-constituting atom number m of the heterofullerene is 60.
Figure 2B:
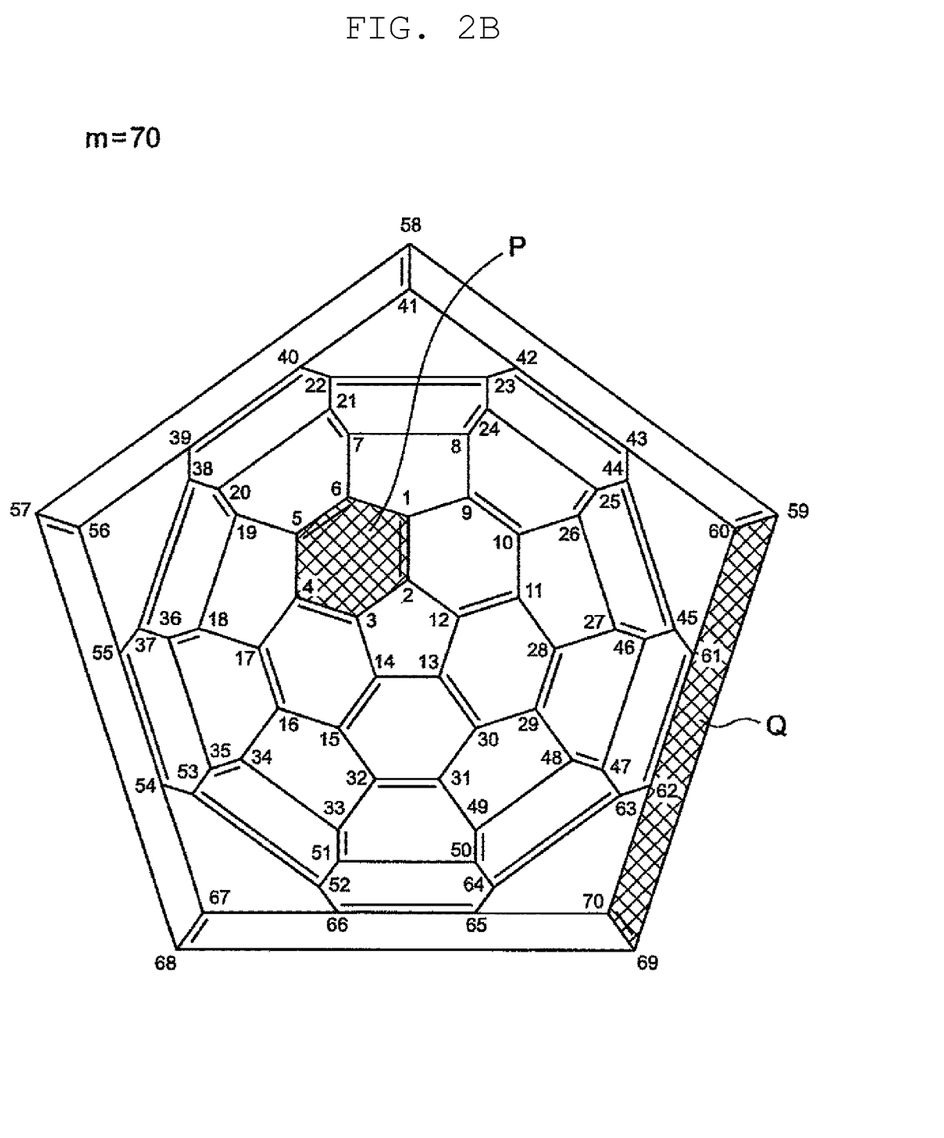
FIG. 2B is a schematic diagram for describing a notation system of preferable substitution positions in a heterofullerene of the present disclosure when a skeleton-constituting atom number m of the heterofullerene is 70.

There is no particular limitation to the substitution positions of the boron atoms as long as the boron atoms having substituted constitute the heterofullerene skeleton. From the point of view of further improvement in the electron mobility, the preferable substitution positions of the boron atoms are as follows. Note that in the following notations, any one of six-membered rings constituting a heterofullerene is referred to as a "six-membered ring P"; one six-membered ring located diametrically opposite to the six-membered ring P is referred to as a "six-membered ring Q"; and a group of six-membered ring groups that is located in an approximately orthogonal direction from a midpoint of the diametrically opposite axis and has an approximately belt shape and an annular shape is referred to as a "six-membered ring group R". For example, if the heterofullerene is supposed as the Earth and the six-membered ring P is supposed as the North Pole, the six-membered ring Q corresponds to the South Pole, and the six-membered ring group R corresponds to the equator. In detail, for example, in a heterofullerene with m=60, when the six-membered ring P is represented by "P" in FIG. 2A, the six-membered ring Q is disposed at "Q", and the six-membered ring group R is disposed at "R". Further, for example, in a heterofullerene with m=70, when the six-membered ring P is represented by "P" in FIG. 2B, the six-membered ring Q is disposed at "Q". The six-membered ring may be constituted only by carbon atoms or by a carbon atom or atoms and a heteroatom or heteroatoms, or may be constituted only by heteroatoms. The six-membered ring group R forms an annular shape while sharing atoms that are common with neighboring six-membered rings.

The preferable substitution positions of the boron atoms include (i) any one or more of the positions of the constituent atoms of the six-membered ring P and (ii) any one or more of at least either the positions of the constituent atoms of the six-membered ring Q or the positions of the constituent atoms of the six-membered ring group R. In particular, in the case of the heterofullerene with m=70, the preferable substitution positions of the boron atoms include (i) any one or more of the positions of the constituent atoms of the six-membered ring P and (ii) any one or more of the positions of the constituent atoms of the six-membered ring Q.

In the case of the heterofullerene with m=60, the positions of the constituent atoms of the six-membered ring P are the 1st, 5th, 6th, 7th, 8th, and 9th positions. In this case, the positions of the constituent atoms of the six-membered ring Q are the 49th, 50th, 51st, 52nd, 59th, and 60th positions. In this case, the positions of the constituent atoms of the six-membered ring group R are the 2nd to 4th, 10th to 48th, and 53rd to 58th positions.

In the case of the heterofullerene with m=70, the positions of the constituent atoms of the six-membered ring P are the 1st, 2nd, 3rd, 4th, 5th, and 6th positions. In this case, the positions of the constituent atoms of the six-membered ring Q are the 59th, 60th, 61st, 62nd, 69th, and 70th positions.

For example, in the case of m=60 and n=2, the substitution positions of the two boron atoms include (i) any one of the positions (in particular, the 1st position) of the constituent atoms of the six-membered ring P and (ii) any one of the positions (in particular the 16th, 50th, 60th, 57th, or 31st position) of the constituent atoms of the six-membered ring Q and the positions of the constituent atoms of the six-membered ring group R. In this case, the substitution positions of the two boron atoms preferably include (i) any one of the positions (in particular, the 1st position) of the constituent atoms of the six-membered ring P and (ii) any one of the positions (in particular, the 57th or 31st position) of the constituent atoms of the six-membered ring Q.

Further, for example, in the case of m=60 and n=4, the substitution positions of the four boron atoms include (i) any two of the positions of the constituent atoms of the six-membered ring P and (ii) any two of the positions of the constituent atoms of the six-membered ring Q and the positions of the constituent atoms of the six-membered ring group R. In this case, the substitution positions of the four boron atoms preferably include (i) any two of the positions (in particular, the 1st and 7th positions) of the constituent atoms of the six-membered ring P and (ii) any two of the positions (in particular, the 50th and 60th positions) of the constituent atoms of the six-membered ring Q.

Further, for example, in the case of m=60 and n=6, the substitution positions of the six boron atoms include (i) any two of the positions of the constituent atoms of the six-membered ring P and (ii) any four of the positions of the constituent atoms of the six-membered ring Q and the positions of the constituent atoms of the six-membered ring group R. In this case, the substitution positions of the six boron atoms preferably include (i) any two of the positions (in particular, the 1st and 7th positions) of the constituent atoms of the six-membered ring P, (ii) any two of the positions (in particular, the 50th and 60th positions) of the constituent atoms of the six-membered ring Q, and (iii) any two of the positions (in particular, two positions selected from the group consisting of the 3rd, 13th, 28th, and 31st positions) of the constituent atoms of the six-membered ring group R.

Further, for example, in the case of m=60 and n=8, the substitution positions of the eight boron atoms include (i) any two of the positions of the constituent atoms of the six-membered ring P and (ii) any six of the positions of the constituent atoms of the six-membered ring Q and the positions of the constituent atoms of the six-membered ring group R. In this case, the substitution positions of the eight boron atoms preferably include (i) any two of the positions (in particular, the 1st and 7th positions) of the constituent atoms of the six-membered ring P, (ii) any two of the positions (in particular, the 50th and 60th positions) of the constituent atoms of the six-membered ring Q, and (iii) any four of the positions (in particular, four positions selected from the group consisting of the 3rd, 13th, 21st, 28th, 31st, 38th, 41st, and 57th positions) of the constituent atoms of the six-membered ring group R.

Further, for example, in the case of m=60 and n=10, the substitution positions of the 10 boron atoms include (i) any two of the positions of the constituent atoms of the six-membered ring P and (ii) any eight of the positions of the constituent atoms of the six-membered ring Q and the positions of the constituent atoms of the six-membered ring group R. In this case, the substitution positions of the 10 boron atoms preferably include (i) any two of the positions (in particular, the 1st and 7th positions) of the constituent atoms of the six-membered ring P, (ii) any two of the positions (in particular, the 50th and 60th positions) of the constituent atoms of the six-membered ring Q, and (iii) any six of the positions (in particular, six positions selected from the group consisting of the 3rd, 13th, 21st, 28th, 31st, 38th, 41st, and 57th positions) of the constituent atoms of the six-membered ring group R.

Further, for example, in the case of m=60 and n=12, the substitution positions of the 12 boron atoms include (i) any two of the positions of the constituent atoms of the six-membered ring P and (ii) any 10 of the positions of the constituent atoms of the six-membered ring Q and the positions of the constituent atoms of the six-membered ring group R. In this case, the substitution positions of the 12 boron atoms preferably include (i) any two of the positions (in particular, the 1st and 7th positions) of the constituent atoms of the six-membered ring P, (ii) any two of the positions (in particular, the 50th and 60th positions) of the constituent atoms of the six-membered ring Q, and (iii) any eight of the positions (in particular, the eight positions consisting of the 3rd, 13th, 21st, 28th, 31st, 38th, 41st, and 57th positions) of the constituent atoms of the six-membered ring group R.

Further, for example, in the case of m=70 and n=2, the substitution positions of the two boron atoms include (i) any one of the positions (in particular, the 1st position) of the constituent atoms of the six-membered ring P and (ii) any one of the positions (in particular, the 70th position) of the constituent atoms of the six-membered ring Q.

Further, for example, in the case of m=70 and n=4, the substitution positions of the four boron atoms include (i) any two of the positions of the constituent atoms of the six-membered ring P and (ii) any two of the positions of the constituent atoms of the six-membered ring Q and the positions of the constituent atoms of the six-membered ring group R. In this case, the substitution positions of the four boron atoms preferably include (i) any two of the positions (in particular, the 1st and 4th positions) of the constituent atoms of the six-membered ring P and (ii) any two of the positions (in particular, the 60th and 70th positions) of the constituent atoms of the six-membered ring Q.

Specific examples of the preferable boraheterofullerene are as follows. The specific examples are represented as "the substitution positions of heteroatoms-C:the number of carbon atoms X:the number of heteroatoms (X represents heteroatom). For example, it is shown that compound b1 is heterofullerene constituted by 58 carbon atoms and two boron atom for one molecule and that the substitution positions of the heteroatoms (boron atoms) are the 1st and 16th positions.

<m=60, n=2, X=boron atom>
 Compound b1: 1,16-$C_{58}B_2$
 Compound b2: 1,50-$C_{58}B_2$
 Compound b3: 1,60-$C_{58}B_2$
 Compound b4: 1,57-$C_{58}B_2$ Compound b5: 1,31-$C_{58}B_2$
Compound b6: 1,7,50,60-$C_{56}B_4$
<m=60, n=6, X=boron atom>
   Compound b7: 1,3,7,13,50,60-$C_{54}B_6$
   Compound b8: 1,7,41,50,57,60-$C_{54}B_6$
   Compound b9: 1,7,28,31,50,60-$C_{54}B_6$
   Compound b10: 1,7,21,38,50,60-$C_{54}B_6$
<m=60, n=8, X=boron atom>
   Compound b11: 1,3,7,13,41,50,57,60-$C_{52}B_8$
   Compound b12: 1,7,21,28,31,38,50,60-$C_{52}B_8$
<m=60, n=10, X=boron atom>
   Compound b13: 1,3,7,13,21,38,41,50,57,60-$C_{50}B_{10}$
   Compound b14: 1,3,7,13,28,31,41,50,57,60-$C_{50}B_{10}$
   Compound b15: 1,3,7,13,21,28,31,38,50,60-$C_{50}B_{10}$
   Compound b16: 1,7,21,28,31,38,41,50,57,60-$C_{50}B_{10}$
<m=60, n=12, X=boron atom>
   Compound b17: 1,3,7,13,21,28,31,38,41,50,57,60-$C_{48}B_{12}$
<m=70, n=2, X=boron atom>
   Compound b18: 1,70-$C_{68}B2$
<m=70, n=4, X=boron atom>
   Compound b19: 1,4,60,70-$C_{66}B_4$ (Azaheterofullerene)

The azaheterofullerene of the present disclosure is a fullerene derivative, in which n number of carbon atoms constituting the fullerene are substituted by n number of nitrogen atoms or n number of nitrogen atoms. The number n is the same as the above number n. From the point of view of further improvement in the electron mobility in azaheterofullerene, n is preferably an even number from 2 to 12, is more preferably an even number from 2 to 10, and is further preferably an even number from 2 to 4.

A skeleton-constituting atom number m of the azaheterofullerene of the present disclosure is the same as the skeleton-constituting atom number m of the boraheterofullerene. From the point of view of a balance between further improvement in the electron mobility and reduction in a manufacturing cost, the skeleton-constituting atom number m of the azaheterofullerene is preferably 60 or 70. The skeleton-constituting atom number m of the azaheterofullerene exactly is a total number of all the atoms constituting the heterofullerene skeleton, and is the same as a number of all the carbon atoms constituting the skeleton of the fullerene before substitution by nitrogen atoms, or is the same as the total number of the number of all the carbon atoms and the number of all the nitrogen atoms both constituting the skeleton of the azaheterofullerene.

There is no particular limitation to the substitution positions of the nitrogen atoms as long as the nitrogen atoms having substituted constitute the heterofullerene skeleton. From the point of view of further improvement in the electron mobility, the preferable substitution positions of the nitrogen atoms are as follows. Note that, in the following notations, "six-membered ring P", "six-membered ring Q", and "six-membered ring group R" are respectively the same as "six-membered ring P", "six-membered ring Q", and "six-membered ring group R" in the boraheterofullerene.

The preferable substitution positions of the nitrogen atoms include only any two or more of the positions of the constituent atoms of the six-membered ring P or include any one or more of the positions of the constituent atoms of the six-membered ring P and one or more of the positions of the constituent atoms of the six-membered ring Q.

For example, in the case of m=60 and n=2, the substitution positions of the two nitrogen atoms include (i) only any two of the positions (in particular, the 1st and 7th positions) of the constituent atoms of the six-membered ring P or (ii) any one of the positions (in particular, the 1st position) of the constituent atoms of the six-membered ring P and any one of the positions (in particular, the 60th position) of the constituent atoms of the six-membered ring group Q.

Further, for example, in the case of m=60 and n=4, the substitution positions of the four nitrogen atoms include (i) any two of the positions of the constituent atoms of the six-membered ring P and (ii) any two of the positions of the constituent atoms of the six-membered ring Q. In this case, the substitution positions of the four nitrogen atoms preferably include (i) any two of the positions (in particular, the 1st and 7th positions) of the constituent atoms of the six-membered ring P and (ii) any two of the positions (in particular, the 50th and 60th positions) of the constituent atoms of the six-membered ring Q.

Specific examples of the preferable azaheterofullerene are as follows. The specific examples are represented, in the same manner as the specific examples of boraheterofullerene, as "the substitution positions of heteroatoms-C:the number of carbon atoms X:the number of heteroatoms (X represents heteroatom).

<m=60, n=2, X=nitrogen atom>
   compound n1: 1,60-$C_{58}N_2$
   compound n2: 1,7-$C_{58}N_2$
<m=60, n=4, X=nitrogen atom>
   compound n3: 1,7,50,60-$C_{56}N_4$

[Production Method of Heterofullerene]

The heterofullerene of the present disclosure can be produced by an ion implantation process performed on a pure fullerene film. In detail, a heterofullerene is produced as follows: a pure fullerene film is produced by using a predetermined fullerene, predetermined heteroatoms are ion-implanted into the pure fullerene film, and then, the fullerene film is subjected to an annealing treatment. Because the heterofullerene is obtained as a mixture with fullerene in the fullerene film obtained after the annealing treatment, when the fullerene film is subjected to a separation treatment such as column chromatography, the heterofullerene can be separated and isolated.

The pure fullerene film can be produced by a known film forming method such as a vacuum vapor deposition method or a spin coating method. A film thickness of the pure fullerene film is not particularly limited and may be normally more than or equal to 100 nm and less than or equal to 1,000 nm.

In the ion implantation process, a heteroatom-containing compound in a gaseous state is ionized and is electrically accelerated by an applied electric field, and the ions are forced to be implanted into an object (the pure fullerene film). When the heteroatom ions are implanted into the pure fullerene film by the above process, part of the carbon atoms of the fullerene molecule are substituted by the heteroatoms. Depending on how carbon atoms are substituted, there are generated molecules having an unpaired electron; however, these molecules are polymerized by a subsequent annealing treatment so that the molecules can be easily separated by column chromatography or other methods. There is no particular limitation to the heteroatom-containing compound to be ionized as long as the compound can be gasified. For example, when the heteroatoms are boron atoms, a boron trifluoride gas can be used.

Further, for example, when the heteroatoms are nitrogen atoms, a nitrogen gas can be used.

By adjusting an acceleration energy, the number of substituent heteroatoms for one fullerene molecule can be controlled. For example, the larger the acceleration energy is, the greater the number of the substituent heteroatoms is.

Further, for example, the smaller the acceleration energy is, the smaller the number of the substituent heteroatoms is. The acceleration energy may be, for example, greater than or equal to 1 keV and smaller than or equal to 10 MeV.

The annealing treatment may be performed normally at a temperature higher than or equal to 150° C. and lower than or equal to 300° C. An annealing time may be, for example, from one minute to several hours.

By forming the pure fullerene film first on an electrode, the heterofullerene-containing fullerene film obtained after the annealing treatment can be used as a semiconductor film as is.

[Identification of Heterofullerene]

Even if several types of heterofullerenes are obtained in the above production method of heterofullerene, each type of heterofullerene can be separated and isolated depending on the types by performing the above separation processing. In this case, if the above production process of heterofullerene is performed in a large scale, each type of heterofullerene can be easily separated and isolated.

The several types of heterofullerenes are the several types of heterofullerenes in which there is a difference in type, number, and substitution positions of the heteroatoms that substitute for one fullerene molecule.

Different types of heterofullerenes that are different in the type and the number (per one molecule) of heteroatoms can be each identified by elemental analysis and mass spectrometry. In detail, the elemental analysis is used to identify the atoms constituting one molecular of heterofullerene, and the mass spectrometry is used to measure a molecular weight of the heterofullerene, so that a molecular formula of the heterofullerene can be determined. As a result, the heterofullerenes that are different in the type and the number of heteroatoms can be each identified.

The heterofullerenes in which the substitution positions of the heteroatoms are different can be each identified by using $C^{13}$-nuclear magnetic resonance (NMR). In detail, by analysis of an amount of chemical shift of each peak obtained by $C^{13}$-NMR, the heterofullerene having different substitution positions of heteroatoms can be identified.

[Use of Heterofullerene]

The heterofullerene of the present disclosure has a further sufficiently high electron mobility and is therefore useful as a molecule-based organic semiconductor material or a carbon-based electron transfer material, in particular, an n-type semiconductor material. Therefore, when the heterofullerene of the present disclosure is used for an electronic device (electronic element) such as a transistor, a frequency characteristic of the electronic device can be improved.

Figure 3:
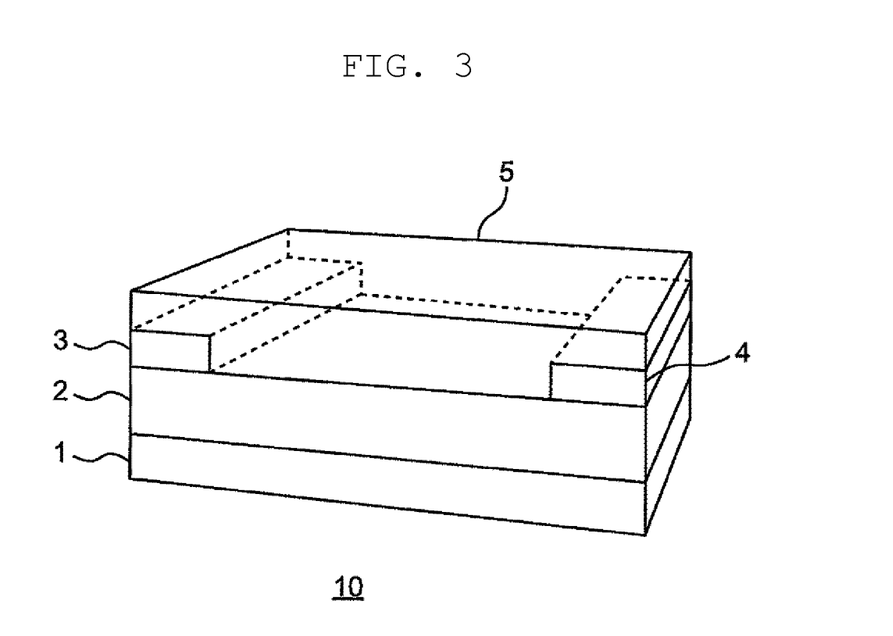
FIG. 3 is a schematic structural diagram showing an example of a basic structure of a transistor using the heterofullerene of the present disclosure.

FIG. 3 shows an example of a basic structure of a transistor using the heterofullerene of the present disclosure. With reference to FIG. 3, basic transistor structure body 10 includes: gate electrode 1; gate insulating film 2 formed on gate electrode 1; source electrode 3 and drain electrode 4 separately formed on gate insulating film 2; and semiconductor film 5 formed in contact with an exposed area of gate insulating film 2 and in contact with source electrode 3 and drain electrode 4.

There is no particular limitation to a material that constitutes gate electrode 1 as long as the material is used as an electrode material in the field of electronic devices, and examples of the material include silicon, gold, copper, nickel, and aluminum.

There is no particular limitation to a material that constitutes gate insulating film 2 as long as the material has electrical insulation properties. Specific examples of the material that constitutes gate insulating film 2 include, for example: metal oxides or metal nitrides such as silicon oxide (such as $SiO_2$), silicon nitride (such as $Si_3N_4$), tantalum oxide (such as $Ta_2O_5$), aluminum oxide (such as $Al_2O_3$), titanium oxide (such as $TiO_2$), yttrium oxide (such as $Y_2O_3$), and lanthanum oxide (such as $La_2O_3$); and polymer materials such as epoxy resin, polyimide (PI) resin, polyphenylene ether (PPE) resin, polyphenylene oxide resin (PPO), and polyvinyl pyrrolidone (PVP) resin.

The material that constitutes source electrode 3 and drain electrode 4 may be the material exemplified as the material that constitutes gate electrode 1.

Semiconductor film 5 contains the heterofullerene of the present disclosure. As long as semiconductor film 5 contains the heterofullerene of the present disclosure, semiconductor film 5 may contain other materials. For example, semiconductor film 5 may be constituted only by the heterofullerene of the present disclosure, or may contain the heterofullerene of the present disclosure and fullerene. A content amount of the heterofullerene of the present disclosure in semiconductor film 5 is, for example, more than or equal to 1 mass %, is preferably more than or equal to 10 mass % from the point of view of further improvement in the electron mobility, and is more preferably more than or equal to 50 mass %.

Figure 4:
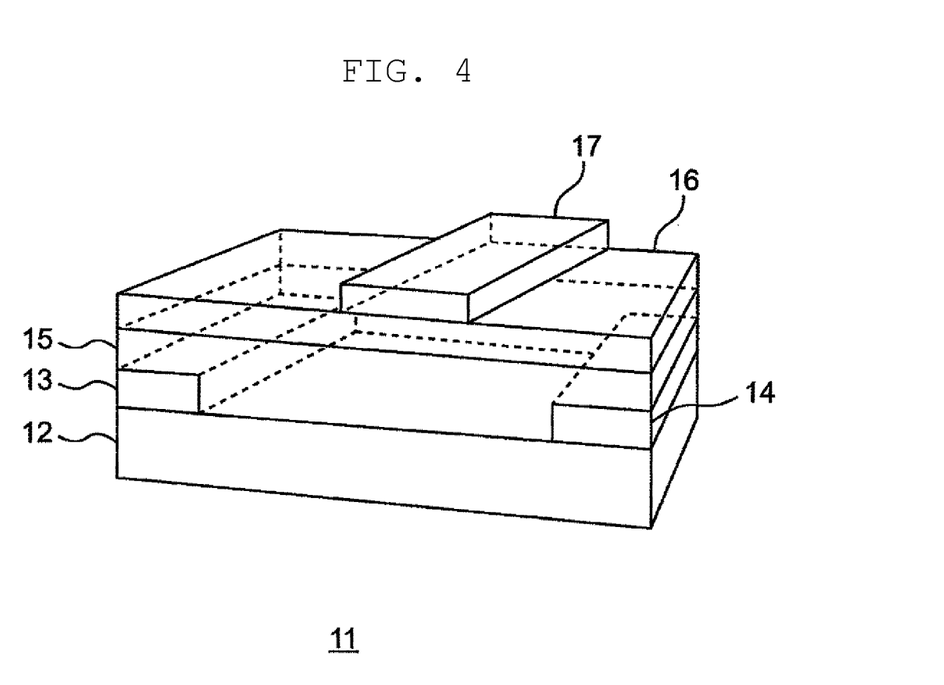
FIG. 4 is a schematic structural diagram showing an example of a basic structure of a transistor using the heterofullerene of the present disclosure.

FIG. 4 further shows an example of the basic structure of a transistor using the heterofullerene of the present disclosure. With reference to FIG. 4, basic transistor structure body 11 includes: base substrate 12 having insulation properties; source electrode 13 and drain electrode 14 separately formed on base substrate 12 having insulation properties; semiconductor film 15 formed in contact with an exposed area of base substrate 12 having insulation properties and in contact with source electrode 13 and drain electrode 14; gate insulating film 16 formed on semiconductor film 15; and gate electrode 17 formed at a position, on gate insulating film 16, between source electrode 13 and drain electrode 14 as viewed from above.

There is no particular limitation to the material constituting base substrate 12 having insulation properties as long as the material has electrical insulation properties. Specific examples of a material that constitutes base substrate 12 include the following material formed on a silicon wafer, for example: metal oxides or metal nitrides such as silicon oxide (such as $SiO_2$), silicon nitride (such as $Si_3N_4$), tantalum oxide (such as $Ta_2O_5$), aluminum oxide (such as $Al_2O_3$), titanium oxide (such as $TiO_2$), yttrium oxide (such as $Y_2O_3$), and lanthanum oxide (such as $La_2O_3$); and polymer materials such as epoxy resin, polyimide (PI) resin, polyphenylene ether (PPE) resin, polyphenylene oxide resin (PPO), and polyvinyl pyrrolidone (PVP) resin.

The material that constitutes source electrode 13 and drain electrode 14 is not particularly limited as long as the material is used as an electrode material in the field of electronic devices, and examples of the material include silicon, gold, copper, nickel, and aluminum.

Semiconductor film 15 contains the heterofullerene of the present disclosure. As long as semiconductor film 15 contains the heterofullerene of the present disclosure, semiconductor film 15 may contain other materials. For example, semiconductor film 15 may be constituted only by the heterofullerene of the present disclosure, or may contain the heterofullerene of the present disclosure and fullerene. A content amount of the heterofullerene of the present disclosure in semiconductor film 15 is, for example, more than or equal to 1 mass %, is preferably more than or equal to 10 mass % from the point of view of further improvement in the electron mobility, and is more preferably more than or equal to 50 mass %.

There is no particular limitation to a material that constitutes gate insulating film 16 as long as the material has electrical insulation properties. Specific examples of the material that constitutes gate insulating film 16 include, for example: metal oxides or metal nitrides such as silicon oxide (such as $SiO_2$), silicon nitride (such as $Si_3N_4$), tantalum oxide (such as $Ta_2O_5$), aluminum oxide (such as $Al_2O_3$), titanium oxide (such as $TiO_2$), yttrium oxide (such as $Y_2O_3$), and lanthanum oxide (such as $La_2O_3$); and polymer materials such as epoxy resin, polyimide (PI) resin, polyphenylene ether (PPE) resin, polyphenylene oxide resin (PPO), and polyvinyl pyrrolidone (PVP) resin.

The material that constitutes gate electrode 17 may be the material exemplified as the material that constitutes source electrode 13 and drain electrode 14.

EXAMPLE

Experimental Example I

The present inventors calculated electron mobility of heterofullerene, based on molecular dynamics and molecular orbital calculation. As a calculation method of mobility, the method described in NPL 1 was used.

Specifically, a charge hopping rate (K) required to calculate mobility is known to be given by the following equation.

[Mathematical Expression 1]

$$\kappa = \frac{2\pi}{\hbar}\left(\frac{H_{ab}^2}{\sqrt{4\pi\lambda k_B T}}\right)\exp\left(-\frac{(\Delta G + \lambda)^2}{\sqrt{4\lambda k_B T}}\right)$$

where $\Delta G$ is change in free energy upon charge transfer, $\lambda$ is Marcus reorganization energy, $H_{ab}$ is electronic coupling between molecules, $k_B$ is Boltzmann constant, and T is temperature.

$$\hbar \quad (2)$$

is Planck's constant.

In calculation of κ, 512 object molecules were disposed at random, an equilibrium state of the object molecules was calculated by molecular dynamics calculation for several 10 ns at room temperature. From the result obtained by the above calculation, 50 to 200 molecular pairs were arbitrary picked up, and κ was calculated by density-functional theory for every picked-up pair.

For the above molecular dynamics calculation, Desmond, which was a package for molecular dynamics calculation, was used (see NPL 2). Further, for the calculation of λ and Hab, Jaguar (NPL 3), which was calculation software for density-functional theory, was used.

In this way, calculation by a density-functional theory was performed for each molecular pair to obtain 50 to 200 κ's values, and to calculate mobility from these values, a method considering percolation described in NPL 1 was used.

Specifically, mobility $\mu_{h,p}(p)$ was calculated by the following equation. In the equation, e is an elementary charge.

[Mathematical Expression 3]

$$\mu_{h,p}(p) = \frac{eD_p}{k_B T} \times \theta(p)$$

Further, $D_p$ is given by the equation below.

[Mathematical Expression 4]

$$D_p = \frac{1}{2n}\sum_i D_{h,i} P_i (D_{h,i} \geq D_{th} \text{ for all } i)$$

$P_i$ is given by the equation below.

[Mathematical Expression 5]

$$P_i = \frac{\kappa_i}{\sum_k \kappa_i}$$

Further, $D_{h,i}$ is given by the equation below.

[Mathematical Expression 6]

$$D_{h,i} = \frac{1}{2n} r_i^2 \kappa_i$$

Note that i is a number assigned to each molecular pair. The value $r_i$ is a distance between molecules in the i-th molecular pair.

In addition, the value $D_{th}$ represents an amount satisfying the equation below.

[Mathematical Expression 7]

$$D_p \theta(p) \leq D_{th} \quad (A)$$

In addition, $\theta(p)$ is given by the equation below.

[Mathematical Expression 8]

$$\theta(p) = \left(\frac{p - p_c}{1 - p_c}\right)^\nu \quad (B)$$

$D_{th}$ was self-consistently determined from Equations (A) and (B). Further, $P^c$ is 0.3116, and ν is 2.

The electron mobilities in hetero-substituted fullerenes with respect to the $C_{60}$ structure calculated by this method are shown below.

TABLE 1

|  | Mobility (cm$^2$/Vs) |
| --- | --- |
| $C_{60}$ | 6.0 |
| 1, 16 · $C_{58}B_2$ | 7.8 |
| 1.50 · $C_{58}B_2$ | 8.5 |
| 1, 60 · $C_{58}B_2$ | 8.7 |
| 1, 57 · $C_{58}B_2$ | 10.2 |
| 1, 31 · $C_{58}B_2$ | 13.4 |
| 1, 60 · $C_{58}N_2$ | 6.8 |
| 1, 7 · $C_{58}N_2$ | 7.9 |

As shown in Table 1, it was found that, when substitution with two boron atoms or two nitrogen atoms was performed on fullerene $C_{60}$ (electron mobility 6.0 cm$^2$/Vs), the electron mobility was improved.

For example, in the following case, the electron mobility was improved to be 7.5 cm$^2$/Vs or higher.

The case where n was 2 and the substitution positions of the two boron atoms were the 1st and 16th positions, the 1st and 50th positions, the 1st and 60th positions, the 1st and 57th positions, or the 1st and 31st positions.

In particular, in the following case, the electron mobility was improved to be 10 cm$^2$/Vs or higher. The case where n was 2 and the substitution positions of the two boron atoms were the 1st and 57th positions or the 1st and 31st positions.

Further, for example, in the following case, the electron mobility was improved to be the mobility (for example 6.5 cm$^2$/Vs or higher) higher than the mobility of fullerene C$_{60}$.

The case where n was 2 and the substitution positions of the two nitrogen atoms were the 1st and 60th positions or the 1st and 7th positions.

In particular, in the following case, the electron mobility was improved to be 7.5 cm$^2$/Vs or higher.

The case where n was 2 and the substitution positions of the two nitrogen atoms were the 1st and 7th positions.

TABLE 2

|  | Mobility (cm$^2$/Vs) |
|---|---|
| C$_{60}$ | 6.0 |
| 1, 7, 50, 60 · C$_{58}$B$_4$ | 9.0 |
| 1, 3, 7, 13, 50, 60 · C$_{54}$B$_6$ | 8.5 |
| 1, 7, 41, 50, 57, 60 · C$_{54}$B$_6$ | 8.4 |
| 1, 7, 28, 31, 50, 60 · C$_{54}$B$_6$ | 8.5 |
| 1, 7, 21, 38, 50, 60 · C$_{54}$B$_6$ | 8.5 |
| 1, 3, 7, 13, 41, 50, 57, 60 · C$_{52}$B$_8$ | 7.9 |
| 1, 7, 21, 28, 31, 38, 50, 60 · C$_{52}$B$_8$ | 7.8 |
| 1, 3, 7, 13, 21, 38, 41, 50, 57, 60 · C$_{50}$B$_{10}$ | 7.7 |
| 1, 3, 7, 13, 28, 31, 41, 50, 57, 60 · C$_{50}$B$_{10}$ | 7.7 |
| 1, 3, 7, 13, 21, 28, 31, 38, 50, 60 · C$_{50}$B$_{10}$ | 7.8 |
| 1, 7, 21, 28, 31, 38, 41, 50, 57, 60 · C$_{50}$B$_{10}$ | 7.9 |
| 1, 3, 7, 13, 21, 28, 31, 38, 41, 50, 57, 60 · C$_{48}$B$_{12}$ | 7.6 |

As shown in Table 2, it was found that when substitution with 4, 6, 8, 10, or 12 boron atoms was performed on fullerene C$_{60}$ (electron mobility 6.0 cm$^2$/Vs), the electron mobility was improved.

For example, in the following cases, the electron mobility was improved to be 7.5 cm$^2$/Vs or higher. The case where n was 4 and the substitution positions of the four boron atoms were the 1st, 7th, 50th, and 60th positions;

the case where n was 6 and the substitution positions of the six boron atoms were the 1st, 3rd, 7th, 13th, 50th, and 60th positions, the 1st, 7th, 41st, 50th, 57th, and 60th positions, the 1st, 7th, 28th, 31st, 50th, and 60th positions, or the 1st, 7th, 21st, 38th, 50th, and 60th positions;

the case where n was 8 and the substitution positions of the eight boron atoms were the 1st, 3rd, 7th, 13th, 41st, 50th, 57th, and 60th positions or the 1st, 7th, 21st, 28th, 31st, 38th, 50th, and 60th positions;

the case where n was 10 and the substitution position of the 10 boron atoms were the 1st, 3rd, 7th, 13th, 21st, 38th, 41st, 50th, 57th, and 60th positions, the 1st, 3rd, 7th, 13th, 28th, 31st, 41st, 50th, 57th, and 60th positions, the 1st, 3rd, 7th, 13th, 21st, 28th, 31st, 38th, 50th, and 60th positions, or the 1st, 7th, 21st, 28th, 31st, 38th, 41st, 50th, 57th, and 60th positions; and the case where n was 12 and the substitution positions of the 12 boron atoms were the 1st, 3rd, 7th, 13th, 21st, 28th, 31st, 38th, 41st, 50th, 57th, and 60th positions.

The electron mobilities of hetero-substituted fullerenes with respect to the C$_{70}$ structure calculated by the above method are shown below.

TABLE 3

|  | Mobility (cm$^2$/Vs) |
|---|---|
| C$_{70}$ | 6.5 |
| 1, 70 · C$_{68}$B$_2$ | 7.0 |

TABLE 3-continued

|  | Mobility (cm$^2$/Vs) |
|---|---|
| 1, 4, 60, 70 · C$_{66}$B$_4$ | 7.1 |

As shown in Table 3, it was found that, when substitution with two or four boron atoms was performed on fullerene C$_{70}$ (electron mobility 6.5 cm$^2$/Vs), the electron mobility was improved.

For example, the electron mobility was improved to be 7.0 cm$^2$/Vs or higher, in the following cases:
the case where n was 2 and the substitution positions of the two boron atoms were the 1st and 70th positions; and the case where n was 4 and the substitution positions of the four boron atoms were the 1st, 4th, 60th, and 70th positions.

<Experimental Example II>

Example 1 and Comparative Example 1

A film of fullerene C$_{60}$ was formed to have a thickness of 500 nm on a silicon wafer by a vacuum vapor deposition method. Subsequently, boron was ion-implanted to the fullerene C$_{60}$ film by using a boron trifluoride gas, and the fullerene C$_{60}$ film was subjected to an annealing treatment at 200° C. for 5 minutes. The annealed film was dissolved in toluene, and C$_{58}$B$_2$ was separated and extracted by column chromatography. Heterofullerene C$_{58}$B$_2$ was confirmed to be generated by the fact that a mass peak corresponding to the molecular weight of fullerene C$_{58}$B$_2$ was observed in mass spectrometry.

An oxide film having a film thickness of 350 nm was formed on a silicon wafer by a thermal oxidation process using an oxidation diffusion furnace. On the oxide film, gold electrodes (having a thickness of 100 nm) having a 5 µm gap between the gold electrodes were formed by a lift-off method, and a film of boraheterofullerene C$_{58}$B$_2$ having a thickness of 200 nm was formed on the gold electrodes and the oxide film by a vacuum vapor deposition method.

Subsequently, a silicon nitride film having a thickness of 100 nm was formed as an insulating layer, and a third electrode was then formed on the silicon nitride film by a lift-off method such that the third electrode was disposed inside the 5 µm clearance between the gold electrodes.

The thus manufactured transistor structure was used to measure the mobility. It is known that the mobility is given by the equation below.

[Mathematical Expression 9]

$$\sqrt{I_d} = \sqrt{\frac{\mu W C_i}{2L}} (V_g - V_{th})$$

where $I_d$ is a drain current, µ is mobility, W is a channel width, L is a channel length, $C_i$ is a capacitance of a gate insulating film per unit area, $V_g$ is a gate voltage, and $V_{th}$ is a threshold voltage. It can be understood that the mobility can be obtained by measuring a dependency of the drain current on the gate voltage by the above equation.

The thus measured electron mobilities of a boraheterofullerene C$_{58}$B$_2$ film and a fullerene C$_{60}$ film containing no boraheterofullerene are shown below.

The fullerene C$_{60}$ film containing no boraheterofullerene (Comparative Example 1): 6.0 cm$^2$/Vs.

The film constituted by boraheterofullerene $C_{58}B_2$ (Example 1): 7.0 cm²/Vs.

As described above, the electron mobility of the film made of boraheterofullerene $C_{58}B_2$ is higher than the electron mobility of the film made of fullerene $C_{60}$ containing no heterofullerene $C_{58}B_2$, and it is therefore shown that boraheterofullerene $C_{58}B_2$ has higher electron mobility than fullerene $C_{60}$.

The heterofullerene of the present disclosure has a further sufficiently high electron mobility and is therefore useful as a molecule-based organic semiconductor material or a carbon-based electron transfer material, in particular, an n-type semiconductor material. Therefore, the heterofullerene of the present disclosure is useful for electronic devices or electronic elements, for example, transistors. The heterofullerene of the present disclosure can improve frequency characteristics of electronic devices

The invention claimed is:

1. A heterofullerene comprising a fullerene $C_{60}$,
wherein the fullerene $C_{60}$ includes n boron atoms substituted for n carbon atoms in the fullerene $C_{60}$, where n is any of 6, 8, 10, and 12,
wherein
when n is 6, a set of substitution positions of six boron atoms is one of: a set of 1st, 3rd, 7th, 13th, 50th, and 60th positions; a set of 1st, 7th, 41st, 50th, 57th, and 60th positions; a set of 1st, 7th, 28th, 31st, 50th, and 60th positions; and a set of 1st, 7th, 21st, 38th, 50th, and 60th positions,
when n is 8, a set of substitution positions of eight boron atoms is one of: a set of 1st, 3rd, 7th, 13th, 41st, 50th, 57th, and 60th positions; and a set of 1st, 7th, 21st, 28th, 31st, 38th, 50th, and 60th positions,
when n is 10, a set of substitution positions of ten boron atoms is one of 1st, 3rd, 7th, 13th, 21st, 38th, 41st, 50th, 57th, and 60th positions; a set of 1st, 3rd, 7th, 13th, 28th, 31st, 41st, 50th, 57th, and 60th positions; a set of 1st, 3rd, 7th, 13th, 21st, 28th, 31st, 38th, 50th, and 60th positions; and a set of 1st, 7th, 21st, 28th, 31st, 38th, 41st, 50th, 57th, and 60th positions, and
when n is 12, a set of substitution positions of twelve boron atoms is a set of 1st, 3rd, 7th, 13th, 21st, 28th, 31st, 38th, 41st, 50th, 57th, and 60th positions.

2. A heterofullerene comprising a fullerene $C_{70}$,
wherein the fullerene $C_{70}$ includes n boron atoms substituted for n carbon atoms in the fullerene $C_{70}$, where n is 2 or 4,
wherein
when n is 2, substitution positions of two boron atoms are 1st and 70th positions, and
when n is 4, substitution positions of four boron atoms are 1st, 4th, 60th, and 70th positions.

3. An n-type semiconductor film comprising the heterofullerene according to claim 1.

4. An electronic device comprising, as an n-type semiconductor, the heterofullerene according to claim 1.

5. An electronic device that is a transistor, the transistor including a source electrode, a drain electrode, a gate electrode, and an n-type semiconductor film,
wherein the n-type semiconductor film includes the heterofullerene according to claim 1.

6. An n-type semiconductor film comprising a heterofullerene,
wherein
the heterofullerene is one selected from
a heterofullerene where two carbon atoms constituting a fullerene $C_{60}$ are substituted by two boron atoms,
a heterofullerene where four carbon atoms constituting a fullerene $C_{60}$ are substituted by four boron atoms,
or a heterofullerene where two carbon atoms constituting a fullerene $C_{60}$ are substituted by two nitrogen atoms,
when the heterofullerene is a heterofullerene where two carbon atoms constituting a fullerene $C_{60}$ are substituted by two boron atoms, substitution positions of the two boron atoms are any of 1st and 16th positions; 1st and 50th positions; 1st and 60th positions; 1st and 57th positions; and 1st and 31st positions,
when the heterofullerene is a heterofullerene where four carbon atoms constituting a fullerene $C_{60}$ are substituted by four boron atoms, substitution positions of the four boron atoms are 1st, 7th, 50th, and 60th positions, and
when the heterofullerene is a heterofullerene where two carbon atoms constituting a fullerene $C_{60}$ are substituted by two nitrogen atoms, substitution positions of the two nitrogen atoms are 1st and 60th positions or 1st and 7th positions.

7. An electric device comprising a heterofullerene as an n-type semiconductor,
wherein
the heterofullerene is one selected from
a heterofullerene where two carbon atoms constituting a fullerene $C_{60}$ are substituted by two boron atoms,
a heterofullerene where four carbon atoms constituting a fullerene $C_{60}$ are substituted by four boron atoms,
or a heterofullerene where two carbon atoms constituting a fullerene $C_{60}$ are substituted by two nitrogen atoms,
when the heterofullerene is a heterofullerene where two carbon atoms constituting a fullerene $C_{60}$ are substituted by two boron atoms, substitution positions of the two boron atoms are any of: 1st and 16th positions; 1st and 50th positions; 1st and 60th positions; 1st and 57th positions; and 1st and 31st positions,
when the heterofullerene is a heterofullerene where four carbon atoms constituting a fullerene $C_{60}$ are substituted by four boron atoms, substitution positions of the four boron atoms are 1st, 7th, 50th, and 60th positions, and
when the heterofullerene is a heterofullerene where two carbon atoms constituting a fullerene $C_{60}$ are substituted by two nitrogen atoms, substitution positions of the two nitrogen atoms are 1st and 60th positions or 1st and 7th positions.

8. An electronic device comprising:
a source electrode;
a drain electrode;
a gate electrode; and
an n-type semiconductor film,
wherein the n-type semiconductor film includes a heterofullerene,
the heterofullerene is one selected from
a heterofullerene where two carbon atoms constituting a fullerene $C_{60}$ are substituted by two boron atoms,
a heterofullerene where four carbon atoms constituting a fullerene $C_{60}$ are substituted by four boron atoms,
or a heterofullerene where two carbon atoms constituting a fullerene $C_{60}$ are substituted by two nitrogen atoms,
when the heterofullerene is a heterofullerene where two carbon atoms constituting a fullerene $C_{60}$ are substituted by two boron atoms, substitution positions of the two boron atoms are any of: 1st and 16th positions; 1st and 50th positions; 1st and 60th positions; 1st and 57th positions; and 1st and 31st positions, when the heterofullerene is a heterofullerene where four carbon atoms constituting a fullerene $C_{60}$ are substituted by four boron atoms, substitution positions of the four boron atoms are 1st, 7th, 50th, and 60th positions, and when the heterofullerene is a heterofullerene where two carbon atoms constituting a fullerene $C_{60}$ are substituted by two nitrogen atoms, substitution positions of the two nitrogen atoms are 1st and 60th positions or 1st and 7th positions.

* * * * *